(12) United States Patent
Choi et al.

(10) Patent No.: US 12,254,922 B2
(45) Date of Patent: Mar. 18, 2025

(54) MEMORY DEVICE INCLUDING SWITCHING MATERIAL AND PHASE CHANGE MATERIAL

(71) Applicant: Samsung Electronics Co., Ltd., Suwon-si (KR)

(72) Inventors: Minwoo Choi, Suwon-si (KR); Young Jae Kang, Suwon-si (KR); Bonwon Koo, Suwon-si (KR); Yongyoung Park, Suwon-si (KR); Hajun Sung, Suwon-si (KR); Dongho Ahn, Suwon-si (KR); Kiyeon Yang, Suwon-si (KR); Wooyoung Yang, Suwon-si (KR); Changseung Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 141 days.

(21) Appl. No.: 18/157,408

(22) Filed: Jan. 20, 2023

(65) Prior Publication Data
US 2024/0046986 A1    Feb. 8, 2024

(30) Foreign Application Priority Data

Aug. 4, 2022 (KR) .................. 10-2022-0097577
Dec. 15, 2022 (KR) .................. 10-2022-0176248

(51) Int. Cl.
*G11C 13/00* (2006.01)
*H10B 63/10* (2023.01)
*H10B 63/00* (2023.01)

(52) U.S. Cl.
CPC ...... *G11C 13/0069* (2013.01); *G11C 13/0004* (2013.01); *H10B 63/10* (2023.02); *G11C 2213/30* (2013.01); *H10B 63/84* (2023.02)

(58) Field of Classification Search
CPC ............ G11C 13/0069; G11C 13/0004; G11C 13/003; G11C 2213/76; G11C 11/5678; G11C 13/004; G11C 2013/0092; G11C 2013/0045; G11C 2013/0052; G11C 2213/72; G11C 2213/30; G11C 2213/77; G11C 11/16; G11C 11/1659; G11C 11/56; G11C 13/0002; G11C 13/0007; G11C 13/0011; G11C 13/0061; G11C 13/0097;
(Continued)

(56) References Cited

U.S. PATENT DOCUMENTS

| 7,638,789 B2 | 12/2009 | Peters |
| 7,864,567 B2 | 1/2011 | Gordon et al. |
| 9,379,321 B1 | 6/2016 | Chang et al. |

(Continued)

FOREIGN PATENT DOCUMENTS

| KR | 10-2020-0041122 A | 4/2020 |
| KR | 10-2020-0129453 A | 11/2020 |
| KR | 10-2021-0119273 A | 10/2021 |

*Primary Examiner* — Thong Q Le
(74) *Attorney, Agent, or Firm* — Harness, Dickey & Pierce, P.L.C.

(57) ABSTRACT

A memory device includes a memory cell including a selection layer and a phase change material layer, and a controller, wherein the selection layer includes a switching material, the phase change material layer includes a phase change material, and the controller is configured to apply a write pulse to the selection layer and the phase change material layer and control a polarity, a peak value, and a shape of the write pulse.

18 Claims, 13 Drawing Sheets

(58) Field of Classification Search
CPC ............ G11C 2213/15; G11C 2213/55; G11C 2213/71
See application file for complete search history.

(56) References Cited

U.S. PATENT DOCUMENTS

| | | |
|---|---|---|
| 9,704,921 B2 | 7/2017 | Kim et al. |
| 9,748,311 B2 | 8/2017 | Fantini et al. |
| 10,062,840 B2 | 8/2018 | Sim et al. |
| 10,084,017 B2 | 9/2018 | Ohba et al. |
| 10,163,977 B1 | 12/2018 | Fantini et al. |
| 10,186,552 B2 | 1/2019 | Choi et al. |
| 10,374,009 B1 | 8/2019 | Cheng et al. |
| 11,107,523 B1 | 8/2021 | Rangan et al. |
| 2017/0125097 A1* | 5/2017 | Tortorelli ........... G11C 13/0069 |
| 2017/0237000 A1 | 8/2017 | Terai et al. |
| 2019/0115071 A1 | 4/2019 | Nardi et al. |
| 2019/0148456 A1 | 5/2019 | Wu et al. |
| 2019/0311768 A1 | 10/2019 | Wang et al. |
| 2020/0118626 A1 | 4/2020 | Lee et al. |
| 2020/0357464 A1 | 11/2020 | Lee |
| 2020/0411754 A1 | 12/2020 | Ruiz et al. |
| 2022/0113892 A1 | 4/2022 | Fugazza et al. |

\* cited by examiner

MEMORY DEVICE INCLUDING SWITCHING MATERIAL AND PHASE CHANGE MATERIAL

CROSS-REFERENCE TO RELATED APPLICATION

This application is based on and claims priority under 35 U.S.C. § 119 to Korean Patent Application No. 10-2022-0097577, filed on Aug. 4, 2022, and Korean Patent Application No. 10-2022-0176248, filed on Dec. 15, 2022 in the Korean Intellectual Property Office, the disclosure of which is incorporated by reference herein in its entirety.

BACKGROUND

1. Field

The disclosure relates to a memory device including a switching material and a phase change material.

2. Description of the Related Art

Recently, with the miniaturization and high performance of electronic devices, demand for improvements in memory devices configured to store information in various electronic devices, such as computers and portable communication devices, has increased. The memory devices include phase-change random access memory (PRAM), resistive random access memory (RRAM), magnetic random access memory (MRAM), and the like, which can store data by using a characteristic of switching between different resistance states according to an applied voltage or current. The memory devices may include an ovonic threshold switch (OTS) material and a phase change material (PCM), which include a chalcogenide material. However, in an OTS material and a PCM, which include an amorphous chalcogenide material, a characteristic shift occurs over time, and as a result, a read window margin decreases, making it difficult to implement a multi-level cell.

SUMMARY

Provided is a memory device having a high read window margin.

Provided is a memory device that enables subdivision of a state to implement a multi-level.

Additional aspects will be set forth in part in the description which follows and, in part, will be apparent from the description, or may be learned by practice of the presented embodiments of the disclosure.

According to at least one embodiment, a memory device includes a memory cell including a selection layer and a phase change material layer, the selection layer comprising a switching material and the phase change material layer comprising a phase change material; and a controller configured to control an application of a write pulse to the memory cell and to control a polarity, a peak value, and a shape of the write pulse.

The controller may be further configured to adjust a resistance of the phase change material by controlling a fall time length of the write pulse.

The controller may be further configured to control the application of a first write pulse to the memory cell, wherein the first write pulse includes a negative polarity, a first peak value, and a rectangular shape.

The memory cell may, after the first write pulse, have a first logic state in which both the switching material and the phase change material have a first high resistance when the first write pulse is applied to the memory cell.

The controller may be configured to control the application of a second write pulse to the memory cell, wherein the second write pulse includes the negative polarity, a second peak value less than the first peak value, and a rectangular shape.

The memory cell may, after the second write pulse, have a second logic state in which both the switching material and the phase change material have a second high resistance when the second write pulse is applied to the memory cell and the second high resistance is less than the first high resistance.

The controller may be further configured to control the application of a third write pulse to the memory cell, wherein the third write pulse includes a positive polarity, a second peak value less than the first peak value, and a rectangular shape.

The memory cell may, after the third write pulse, have a third logic state in which the switching material has a low resistance, and the phase change material has a first high resistance when the third write pulse is applied to the memory cell.

The controller may be configured to control the application of a fourth write pulse to the memory cell, wherein the fourth write pulse includes the negative polarity, a second peak value less than the first peak value, and a trapezoidal shape.

The memory cell may, after the fourth write pulse, have a fourth logic state in which the switching material has a second high resistance and the phase change material has a low resistance when the fourth write pulse is applied to the memory cell, and the second high resistance is less than the first high resistance.

The controller may be further configured to control the application of a fifth write pulse to the memory cell, wherein the fifth write pulse includes a positive polarity, a second peak value less than the first peak value, a first fall time length, and a trapezoidal shape.

The memory cell may, after the firth write pulse, have a fifth logic state in which both the switching material and the phase change material have a low resistance when the fifth write pulse is applied to the memory cell.

The controller may be further configured to the application of a sixth write pulse to the memory cell, wherein the sixth write pulse may include the positive polarity, a third peak value less than the first peak value, a second fall time length greater than the first fall time length, and a trapezoidal shape.

The memory cell may, after the sixth write pulse, have a sixth logic state in which the switching material has a low resistance and the phase change material has a lower resistance compared to the fifth logic state.

The switching material may include a chalcogenide material, wherein the chalcogenide material may include a first element including germanium (Ge), a second element including at least one of arsenic (As) or antimony (Sb), a third element including at least one of tellurium (Te), selenium (Se), or sulfur (S), and a fourth element including at least one of indium (In), aluminum (Al), carbon (C), boron (B), strontium (Sr), gallium (Ga), oxygen (O), nitrogen (N), silicon (Si), calcium (Ca), or phosphorus (P).

The switching material may exhibit an ovonic threshold switching (OTS) material property.

The switching material may be configured such that a resistance of the switching material is changed according to the polarity of an applied write pulse.

The switching material may be configured such that a resistance of the switching material is changed according to the peak value of an applied write pulse.

The phase change material may include a chalcogenide material, wherein the chalcogenide material may include a first element including germanium (Ge), a second element including at least one of arsenic (As) or antimony (Sb), a third element including at least one of tellurium (Te), selenium (Se), or sulfur (S), and a fourth element including at least one of indium (In), aluminum (Al), carbon (C), boron (B), strontium (Sr), gallium (Ga), oxygen (O), nitrogen (N), silicon (Si), calcium (Ca), or phosphorus (P).

The phase change material may be configured such that the resistance of the phase change material may be changed according to a shape of an applied write pulse.

The phase change material may be configured such that the resistance of the phase change material may be changed according to a fall time length of the applied write pulse.

According to at least one embodiment, a memory device includes a selection layer including a switching material, a phase change material layer connected in series with the selection layer, and a controller configured to control an application, to the selection layer and the phase change material layer, of a first write pulse having a first polarity and a first fall time length and of an second write pulse having a second polarity opposite to the first polarity and a second fall time length different from the first fall time length.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
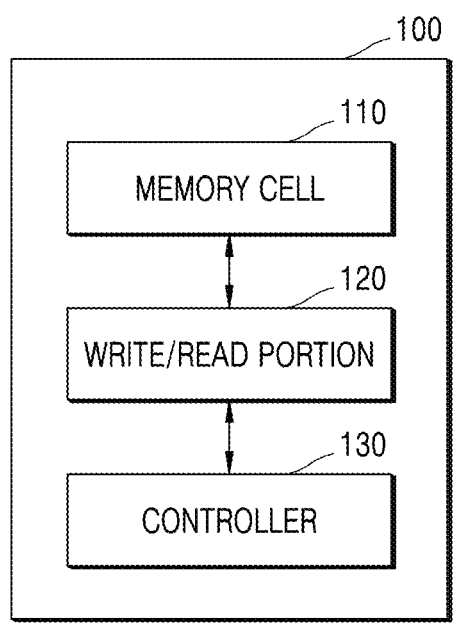
FIG. 1 is a block diagram of a memory device according to at least one embodiment.

Reference will now be made in detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. Terms such as "first", "second", "third", and the like may be used to describe various components but are used only for the purpose of distinguishing one component from other components, and the order, type, and/or the like of the components are not limited.

The elements and/or functional blocks disclosed below may include or be implemented in processing circuitry such as hardware including logic circuits; a hardware/software combination such as a processor executing software; or a combination thereof, unless expressly indicated otherwise. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. and/or electronic circuits including said components. The processing circuitry may include electrical components such as logic gates including at least one of AND gates, OR gates, NAND gates, NOT gates, etc. and/or electronic circuits including said components.

Hereinafter, a memory device including a switching material and a phase change material will be described in detail with reference to the accompanying drawings. Like reference numerals in the drawings denote like components, and sizes of components in the drawings may be exaggerated for convenience of explanation. In addition, embodiments to be described below are only exemplary and various modifications from such embodiments may be possible.

Hereinafter, the term "on" or "above" may include not only one directly above another in contact but also one directly above another without contact. Singular expressions include plural expressions unless they are explicitly and differently specified in context. In addition, when a portion includes a component, a case may mean further including other components without excluding other components unless otherwise described.

The use of the term "above" and similar indicative terms may correspond to both singular and plural. When there is no explicit description or contrary description of operations constituting a method, these operations may be performed in an appropriate order, and may not be necessarily limited to the described order.

Connections of lines between components or connection members illustrated in the drawings exemplarily represent functional connection and/or physical or circuitry connections, and in a real apparatus, may be implemented by replaceable or additional various functional connections, physical connections, or circuitry connections.

The use of all examples or example terms is simply for describing a technical idea in detail, and the scope of the present disclosure is not limited by these examples or example terms unless limited by the claims.

FIG. 1 is a block diagram of a memory device 100 according to at least one embodiment.

Referring to FIG. 1, the memory device 100 may include at least one memory cell 110, a write/read portion 120, and a controller 130.

The memory cell 110 may include a selection layer and a phase change material layer. The resistance of the phase change material layer and the resistance of the selection layer may be changed by a pulse (e.g., a voltage pulse). The resistance of the phase change material layer may be referred to as a variable resistance.

The write/read portion 120 may program the memory cell 110 and read data from the programmed memory cell 110. For example, the write/read portion 120 may program the memory cell 110 to any one of a plurality of resistance states and/or read data from the programmed memory cell 110. The write/read portion 120 may perform a programming operation (a write operation) of programming the memory cell 110 to a target resistance state by using a write pulse and may perform a read operation of reading data from the programmed memory cell 110 by using a read pulse.

The controller 130 may control a write pulse and a read pulse to be applied to the memory cell 110 in the programming operation. The controller 130 may control the resistance of a switching material and a phase change material by controlling the polarity, peak value, and shape of the write pulse. The controller 130 may control the resistance of the phase change material by controlling the length of a fall time of the write pulse. The state of the memory cell 110 may be switched to a target resistance state by the write pulse.

Although the write/read portion 120 and the controller 130 are shown as separate blocks in FIG. 1, the write/read portion 120 and the controller 130 may be electronic circuits disposed on one circuit board together with the memory cell 110. For example, the write/read portion 120 may be an electronic circuit (e.g., a write/read circuit) that applies a write pulse and/or a read pulse to the memory cell 110 through a bit line and a word line or receives a current output from the memory cell 110. In addition, the controller 130 may be an electronic circuit (e.g., a control circuit) that provides a control signal to the write/read portion 120 through a control bus to thereby control the polarity, peak value, and shape of the write pulse applied by the write/read portion 120 to the memory cell 110. Herein peak value represents an absolute value (or magnitude) of the pulse such that a pulse with a negative polarity may have a peak value greater than a pulse with a positive polarity.

Figure 2:
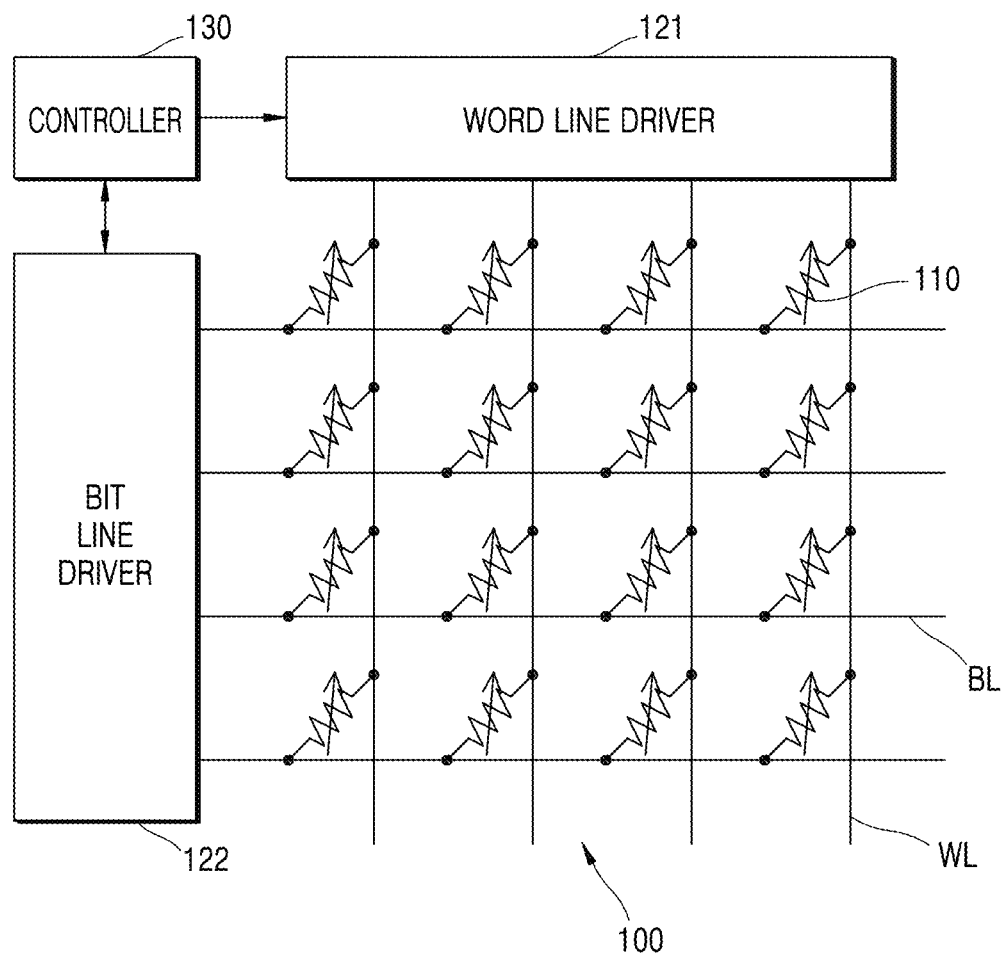
FIG. 2 is an equivalent circuit of the memory device of FIG. 1.

FIG. 2 is an equivalent circuit of the memory device 100 of FIG. 1.

Referring to FIG. 2, the memory device 100 may further include a plurality of first electrode lines WL arranged in parallel and a plurality of second electrode lines BL arranged in parallel to intersect the plurality of first electrode lines WL. In some embodiments, the plurality of first electrode lines WL and the plurality of second electrode lines BL may refer to word lines and bit lines, respectively. A plurality of memory cells 110 may be arranged at intersections of the plurality of first electrode lines WL and the plurality of second electrode lines BL. For example, each of the plurality of memory cells 110 may be connected to a corresponding one of the plurality of first electrode lines WL and a corresponding one of the plurality of second electrode lines BL. The write/read portion 120 may include a word line driver 121 connected to the plurality of first electrode lines WL and a bit line driver 122 connected to the plurality of second electrode lines BL. The controller 130 may be connected to the word line driver 121 and the bit line driver 122 to control operations of the word line driver 121 and the bit line driver 122.

Figure 3:
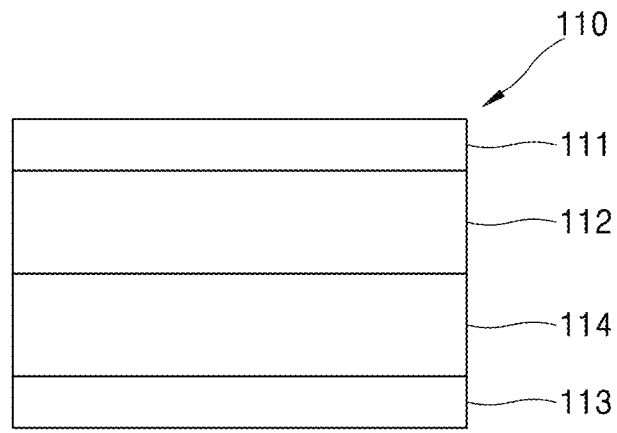
FIG. 3 is a cross-sectional view of a memory cell according to at least one embodiment.

FIG. 3 is a cross-sectional view of a memory cell 110 according to at least one embodiment.

Referring to FIG. 3, the memory cell 110 may include a selection layer 112 and a phase change material layer 114, electrically connected between a first electrode layer 111 and a second electrode layer 113. For example, the selection layer 112 may be directly and/or electrically connected to the first electrode layer 111, and the phase change material layer 114 may be directly and/or electrically connected to the second electrode layer 113. The selection layer 112 and the phase change material layer 114 may be electrically connected to each other in series.

According to at least one embodiment, the first electrode layer 111 and the second electrode layer 113 may be passages through which current flows. At least one of the first electrode layer 111 and the second electrode layer 113 may be connected to the corresponding first electrode line WL and the other may be connected to the corresponding second electrode line BL. When a voltage greater than a threshold voltage is applied between the first electrode layer 111 and the second electrode layer 113, the selection layer 112 enters a low resistance state and current starts to flow, and when a voltage less than the threshold voltage is applied between the first electrode layer 111 and the second electrode layer 113, the selection layer 112 returns to a high resistance state and almost no current flows. Accordingly, the memory cell 110 may be turned on or turned off according to a voltage applied between the first electrode layer 111 and the second electrode layer 113.

The first electrode layer 111 and the second electrode layer 113 may include a conductive material. For example, the conductive material may include a metal, a conductive metal oxide, a conductive metal nitride, a combination thereof, and/or the like. For example, the conductive material may include one or more selected from among carbon (C), titanium nitride (TiN), titanium silicon nitride (TiSiN), titanium carbon nitride (TiCN), titanium aluminum nitride (TiAlN), titanium carbon silicon nitride (TiCSiN), tantalum (Ta), tantalum nitride (TaN), tungsten (W), and/or tungsten nitride (WN), but is not limited thereto.

The selection layer 112 may include a switching material including a chalcogenide material. The chalcogenide material may include at least one chalcogen anion and at least one electropositive element. In at least one example embodiment, the chalcogenide material may include a first element including at least one group IV metalloid (such as germanium (Ge)), a second element including at least one group V metalloid (such as arsenic (As) and/or antimony (Sb)), a third element including at least one chalcogen (e.g., at least one of tellurium (Te), selenium (Se), sulfur(S), and/or the like), and a fourth element including at least one of indium (In), aluminum (Al), carbon (C), boron (B), strontium (Sr), gallium (Ga), oxygen (O), nitrogen (N), silicon (Si), calcium (Ca), and/or phosphorus (P). The selection layer 112 may include a switching material having an ovonic threshold switch (OTS) characteristic. The resistance of the switching material may change according to the polarity of an applied write pulse. The resistance of the switching material may change according to the peak value of the applied write pulse. In at least one embodiment, the selection chalcogenide material may be produced such that the material has a non-centrosymmetric phase (such as an orthorhombic phase) with at least two stable states in each unit cell, which can be switched by the external electrical force (or field).

The selection layer 112 may be formed using vapor deposition, for example, may be formed using physico-chemical vapor deposition. The selection layer 112 may be formed through a physical vapor deposition (PVD) process. The selection layer 112 may be formed through a chemical vapor deposition (CVD) process or an atomic layer deposition (ALD) process. The selection layer 112 may be formed to have a small thickness by co-sputtering deposition. For example, the thickness of the selection layer 112 may be about 5 nm or more and/or about 50 nm or less.

The phase change material layer 114 may include a phase change material including a chalcogenide material. The chalcogenide material may include a first element including at least one group IV metalloid (such as Ge and/or tin (Sn)), a second element including at least one group V metalloid (such as As or Sb), a third element including at least one chalcogen (e.g., at least one of Te, Se, and S), and a fourth element including at least one of In, Al, C, B, Sr, Ga, O, N, Si, Ca, and P. The resistance of the phase change material may change according to the shape of an applied write pulse, for example, the peak value of the write pulse and/or the length of a fall time of the write pulse. For example, the phase of the phase change material layer 114 may be changed based on shape of an applied write pulse. In at least one embodiment, the phase change chalcogenide material may be produced such that the material has a lower crystallization and/or glass transition temperature compared to the switching material included in the selection layer 210. For example, the ratio of elements and/or distribution of elements in the phase change chalcogenide material may differ from the selection chalcogenide material.

The memory cell 110 may be written to store one of a plurality of different logic states by a programming operation. The different logic states may be represented by different resistances of the memory cell 110. For example, a '1' logic state may be represented by a first resistance and a '0' logic state may be represented by a second resistance. Furthermore, in at least some embodiments, the memory cell 110 may have three or more multi-level states, that is three or more different resistances, controlled by a programming operation. The resistance indicated by the memory cell 110 may be changed by the selection layer 112 and/or the phase change material layer 114 included in the memory cell 110.

For example, the selection layer 112 may be written to store one of a plurality of different logic states by a programming operation. The different logic states may be represented by different resistances of the selection layer 112. The resistance indicated by the selection layer 112 may be based on a state of the switching material that is included in the selection layer 112 and has an OTS characteristic.

The state of the switching material may be based, at least in part, on the polarity of a write pulse applied to the memory cell 110 during a programming operation. The polarity of the write pulse may vary depending on the polarity of the current and/or voltage of the write pulse. The state of the switching material may be based, at least in part, on the peak value of a write pulse applied to the memory cell 110 during a programming operation. The peak value of the write pulse may vary depending on the magnitude of the current and/or voltage of the write pulse.

The phase change material layer 114 may be written to store one of a plurality of different logic states by a programming operation. The different logic states may be represented by different resistances of the phase change material layer 114. The resistance indicated by the phase change material layer 114 may be based on a state of a phase change material included in the phase change material layer 114.

The state of the phase change material may be based, at least in part, on the shape of a write pulse applied to the memory cell 110 during a programming operation. The shape of the write pulse may vary depending on a quenching speed of a target phase change material. The resistance value of the phase change material may be determined according to the quenching speed of the phase change material. For example, as a falling time of the write pulse is shortened, the write pulse may have a rectangular shape. In this case, the phase change material may be heated to a temperature higher than a melting temperature for a certain period of time by the supply of a reset write pulse and then rapidly cooled and converted into an amorphous state to have a high resistance value. In addition, as the falling time of the write pulse is increased, the write pulse may have a trapezoidal shape. In this case, the phase change material may be heated to a temperature higher than a crystallization temperature and lower than a melting temperature for a certain period of time by the supply of a set write pulse and then gradually cooled and converted into a crystalline state to have a low resistance value.

The state of the phase change material may be based, at least in part, on the length of a fall time of the write pulse applied to the memory cell 110 during a programming operation. The length of the fall time of the write pulse may vary depending on an amorphous volume and/or a crystalline volume of a target phase change material. As the proportion of the amorphous volume of the phase change material increases, the write pulse may have a short fall time length. As the proportion of the crystalline volume of the phase change material increases, the write pulse may have a long fall time length. Because the resistance value may vary with the amorphous volume or the crystalline volume of the phase change material, the memory cell 110 of a multi-level type may be configured using this characteristic. The state of the phase change material may be independent of the polarity of the current and/or voltage of the write pulse. The write pulse and the read pulse may be applied to the memory cell 110 by using the first electrode line WL and the second electrode line BL of FIG. 2.

Figure 4A:
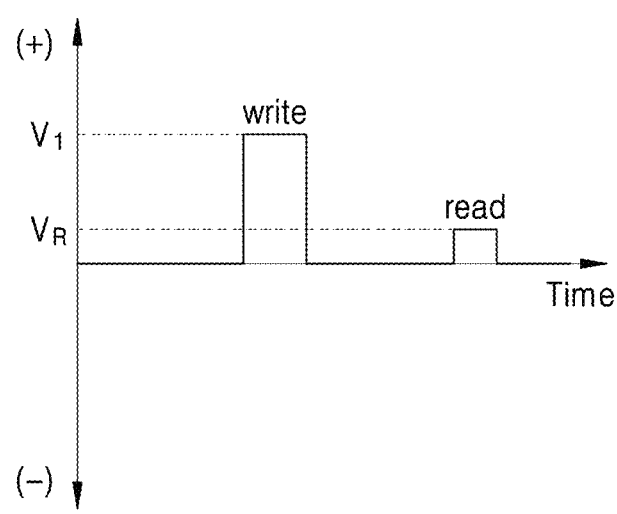
FIGS. 4A to 4C are graphs illustrating types of voltage pulses that may be applied to a switching material according to at least one embodiment.
Figure 4B:
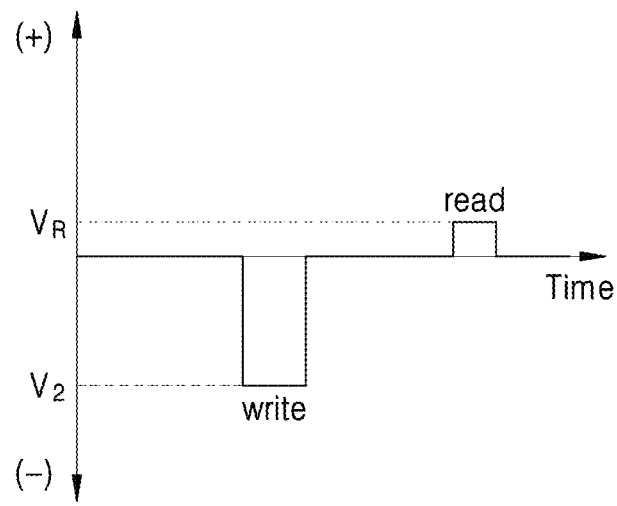
Figure 4C:
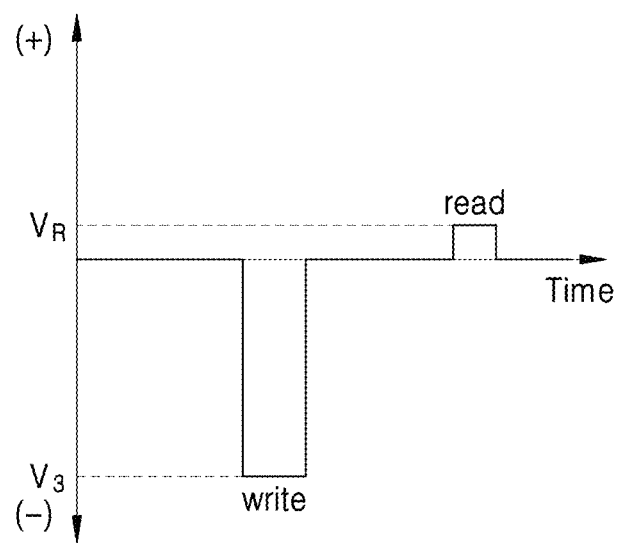

FIGS. 4A to 4C are graphs illustrating types of voltage pulses that may be applied to a switching material according to at least one embodiment.

A change in the resistance of the switching material according to a change in the polarity of a write pulse is described below with reference to FIGS. 4A and 4B. $V_1$ and $V_2$ have the same magnitude and opposite polarity ($V_1 + V_2 = 0$). When the resistance of the switching material according to a write pulse of FIG. 4A is R1-1 and the resistance of the switching material according to a write pulse of FIG. 4B with the polarity of the write pulse of FIG. 4A reversed is R1-2, R1-1 has a smaller value than R1-2. This is due to the polarity-dependent nature of the switching material. For example, when the write pulse has a positive polarity, the threshold voltage of the switching material decreases, and when the write pulse has a negative polarity, the threshold voltage of the switching material increases.

A change in the resistance of the switching material according to a change in the peak value of the write pulse is be described with reference to FIGS. 4B and 4C. V1-2 has an absolute value that is less than that of V1-3. When the resistance of the switching material according to the write pulse of FIG. 4B is R1-2 and the resistance of the switching material according to a write pulse of FIG. 4C is R1-3, R1-2 has a smaller value than R1-3. Accordingly, the strength of the resistance of the switching material may be changed according to the peak value of the write pulse having a negative polarity.

By changing the polarity and the peak value of a voltage pulse applied to the switching material of a selection layer, the resistance of the switching material may be changed to thereby have different resistance values (e.g., R1-1<R1-2<R1-3). Through different resistance values, the state of the switching material may be divided into different logic states, and a multi-level cell may be implemented through the different logic states.

Figure 5A:
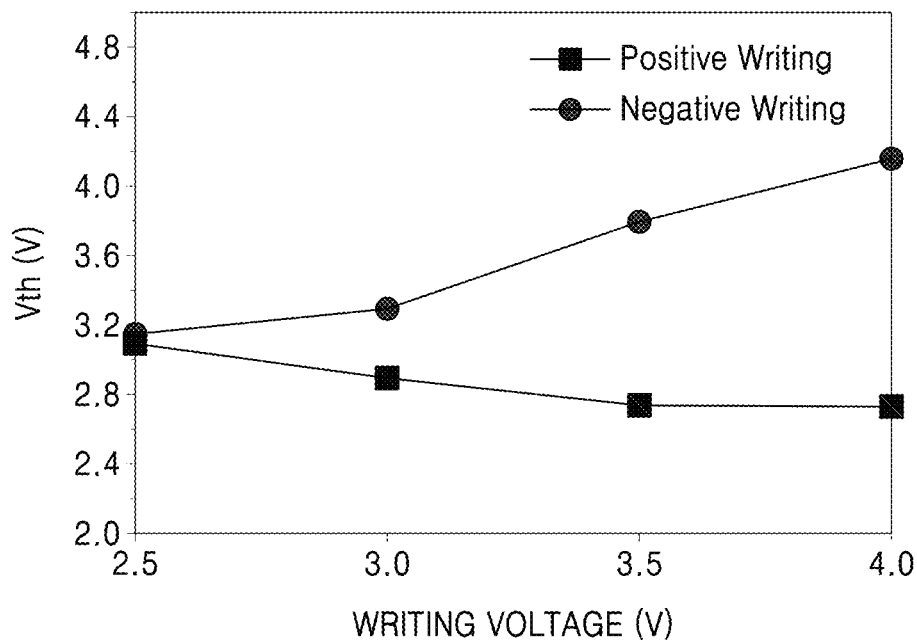
FIGS. 5A and 5B are graphs illustrating a threshold voltage of a memory cell according to at least one embodiment.
Figure 5B:
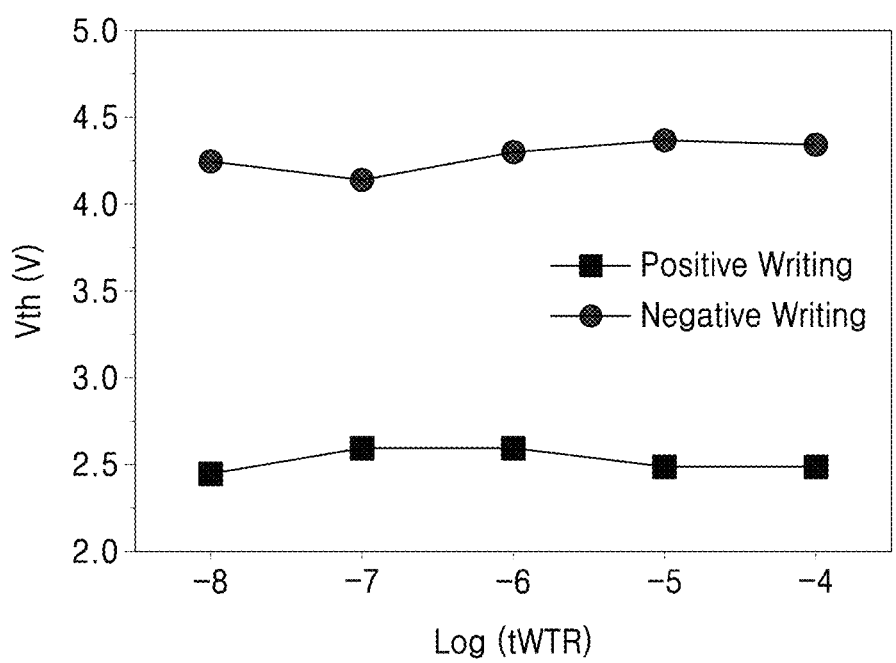

FIGS. 5A and 5B are graphs illustrating a threshold voltage of a memory cell according to at least one embodiment.

Referring to FIG. 5A, a change in the threshold voltage of a switching material according to a change in the polarity and peak value of a write pulse may be seen. With respect to the polarity of the write pulse, a relatively low threshold voltage is obtained after writing is performed with a positive polarity pulse, and a relatively high threshold voltage is obtained after writing is performed with a negative polarity pulse. With respect to the peak value of the write pulse, when writing is performed with a positive polarity pulse, the threshold voltage decreases as the peak value of the write pulse increases, and when writing is performed with a negative polarity pulse, the threshold voltage increases as the peak value of the write pulse increases.

Referring to FIG. 5B, a threshold voltage change pattern according to a write to read time tWTR between a write pulse and a read pulse may be seen. When the write to read time tWTR is changed from 100 μs ($10^{-4}$ seconds) to 10 ns ($10^{-8}$ seconds), the threshold voltage is maintained within a certain range. It may be seen that a pulse is stably driven even with a short write to read time tWTR of 10 ns. Accordingly, the memory device 100 may have a relatively high operating speed.

The threshold voltage of the switching material may be changed by changing the polarity and peak value of a voltage pulse applied to the switching material of the selection layer, the state of the switching material may be divided into different logic states through different threshold voltages, and a multi-level cell may be implemented through the different logic states.

FIGS. 6A to 6D are graphs illustrating types of voltage pulses that may be applied to a phase change material according to at least one embodiment.

Figure 6A:
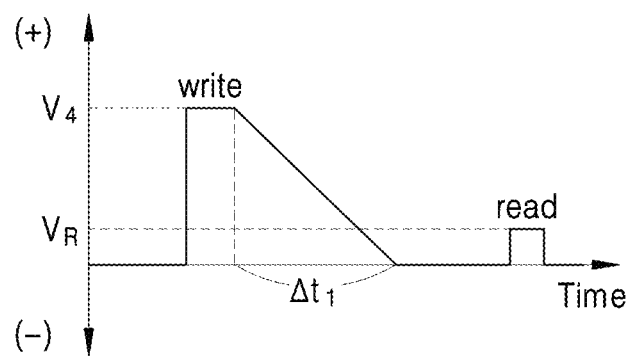
FIGS. 6A to 6D are graphs illustrating types of voltage pulses that may be applied to a phase change material according to at least one embodiment.
Figure 6B:
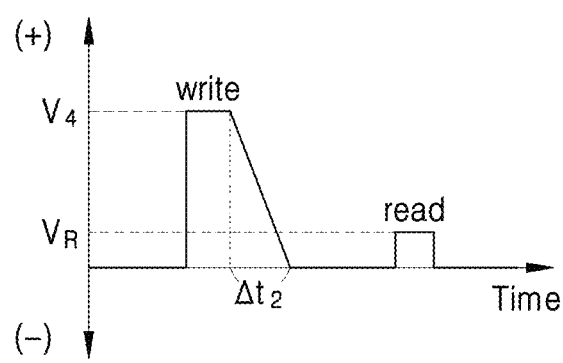

A change in the resistance of the phase change material according to a fall time length Δt of a write pulse is described with reference to FIGS. 6A and 6B. A write pulse of FIG. 6A has a longer fall time length than a write pulse of FIG. 6B. For example, in at least one embodiment, a first fall time length Δt1 of FIG. 6A may be greater than 1000 ns; and a second fall time length Δt2 of FIG. 6B may be greater than 100 ns and less than or equal to 1000 ns. As the write pulse has a short fall time length, the proportion of the amorphous volume of the phase change material may increase. As the write pulse has a long fall time length, the proportion of the crystalline volume of the phase change material may increase. In other words, when the write pulse of FIG. 6A is applied, the proportion of the crystalline volume in the phase change material may increase, and when the write pulse of FIG. 6B is applied, the proportion of the crystalline volume in the phase change material may be lowered compared to when the write pulse of FIG. 6A is applied. Accordingly, when the resistance of the phase change material according to a write pulse of FIG. 6A is R2-1 and the resistance of the phase change material according to a write pulse of FIG. 6B is R2-2, R2-1 has a smaller value than R2-2.

Figure 6C:
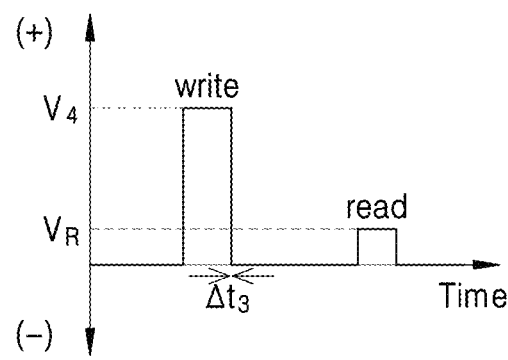

A change in the resistance of the phase change material according to a change in the shape of the write pulse is described with reference to FIGS. 6B and 6C. The write pulse of FIG. 6B has a longer falling time as the phase change material cools gradually and thus has a trapezoidal shape, whereas the write pulse of FIG. 6C has a shorter falling time as the phase change material cools rapidly and thus has a rectangular shape. Specifically, a criterion for dividing the shape of the write pulse into a trapezoidal shape and a rectangular shape may be the fall time length (Δt). In at least one embodiment, the third fall time length Δt3 of FIG. 6C may be 100 ns or less. As shown in FIG. 6C, when the third fall time length Δt3 is 100 ns or less, the write pulse may be considered to have a rectangular shape. As shown in FIG. 6B, when the second fall time length Δt2 is greater than 100 ns, the write pulse may be considered to have a trapezoidal shape. A write pulse having a trapezoidal shape is called a set pulse, and a write pulse having a rectangular shape is called a reset pulse. When the resistance of the phase change material according to the write pulse of FIG. 6B is R2-2 and the resistance of the phase change material according to the write pulse of FIG. 6C is R2-3, R2-2 has a smaller value than R2-3.

Figure 6D:
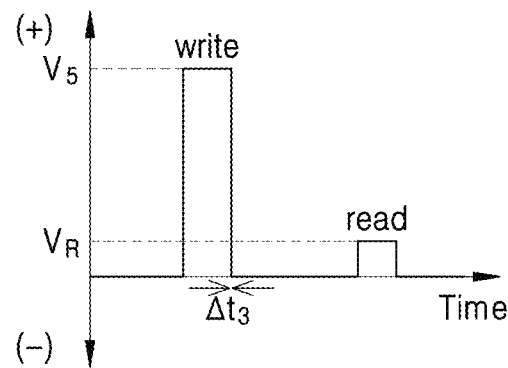

A change in the resistance of the phase change material according to the peak value of a write pulse is described with reference to FIGS. 6C and 6D. A write pulse of FIG. 6D has a higher voltage than a write pulse of FIG. 6C. In other words, V5 of FIG. 6D has a greater value than V4 of FIG. 6C. The peak value of the write pulse may be proportional to the degree of amorphization. In other words, when the write pulse of FIG. 6D is applied, the proportion of the amorphous volume in the phase change material may be higher compared to when the write pulse of FIG. 6C is applied. When the resistance of the phase change material according to the write pulse of FIG. 6C is R2-3 and the resistance of the phase change material according to the write pulse of FIG. 6D is R2-4, R2-3 has a smaller value than R2-4. A similar result will be seen when, e.g., the write pulse is of a negative polarity such that the crystalline volume in the phase change material may be greater when the fall time of the write pulse is longer and less when the fall time of the write pulse is shorter.

By changing the polarity and the peak value of a voltage pulse applied to the phase change material of a phase change material layer, the resistance of the phase change material may be changed to thereby have different resistance values (e.g., R2-1<R2-2<R2-3<R2-4). Through different resistance values, the state of the phase change material may be divided into different logic states, and a multi-level cell may be implemented through the different logic states.

In addition, by combining a voltage pulse that may be applied to the switching material shown in FIGS. 4A to 4C with a voltage pulse that may be applied to the phase change material shown in FIGS. 6A to 6D and applying a voltage pulse obtained by the combination to a memory cell, a memory cell having a multi-level may be implemented.

FIGS. 7A to 7F are graphs illustrating types of voltage pulses that may be applied to a memory cell according to at least one embodiment.

A change in resistance when a write pulse is applied to a switching material and a phase change material is described with reference to FIGS. 7A to 7F.

Figure 7A:
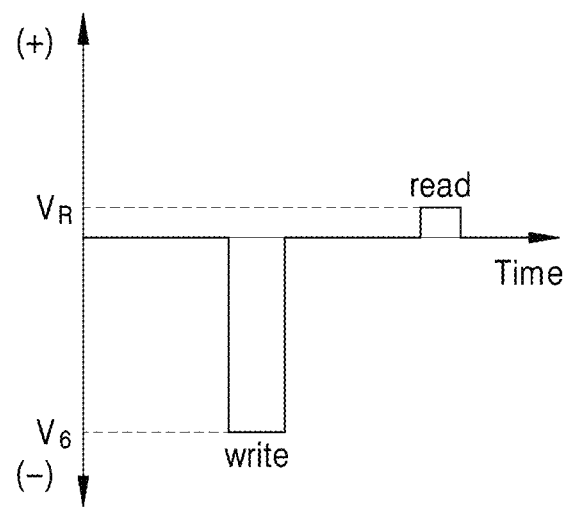
FIGS. 7A to 7F are graphs illustrating types of voltage pulses that may be applied to a memory cell according to at least one embodiment.

Referring to FIG. 7A, a first write pulse, which is a rectangular reset pulse having a negative polarity and a first peak value, may be applied to the memory cell. In this case, the memory cell may have a first logic state (state 1) in which both the switching material and the phase change material have the highest resistance.

Figure 7B:
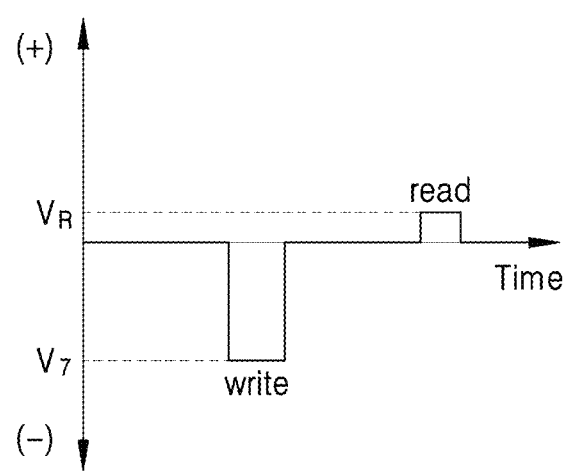

Referring to FIG. 7B, a second write pulse, which is a rectangular reset pulse having a negative polarity and a second peak value less than the first peak value, may be applied to the memory cell. In this case, the memory cell may have a second logic state (state 2) in which both the switching material and the phase change material have a high resistance.

Figure 7C:
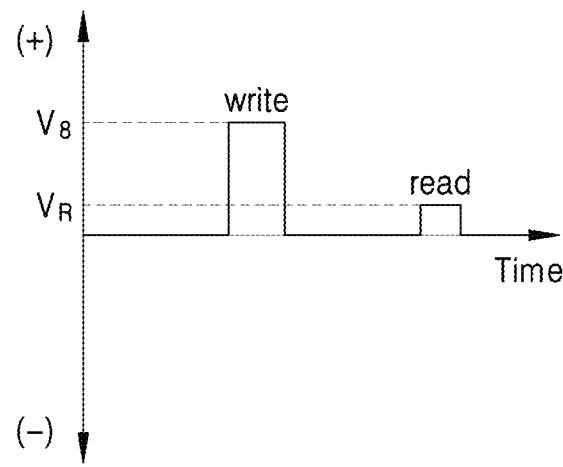

Referring to FIG. 7C, a third write pulse, which is a rectangular reset pulse having a positive polarity and a second peak value less than the first peak value, may be applied to the memory cell. In this case, the memory cell may have a third logic state (state 3) in which the switching material has a low resistance, and the phase change material has a high resistance.

Figure 7D:
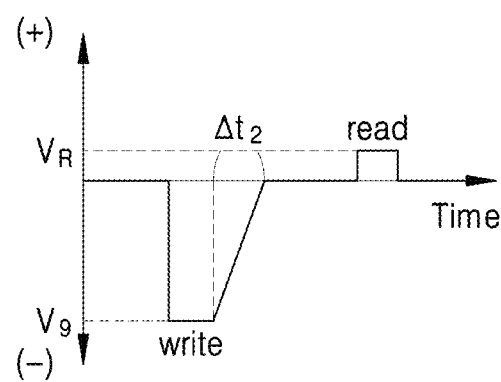

Referring to FIG. 7D, a fourth write pulse, which is a trapezoidal set pulse having a negative polarity and a second peak value less than the first peak value, may be applied to the memory cell. In this case, the memory cell may have a fourth logic state (state 4) in which the switching material has a high resistance and the phase change material has a low resistance.

Figure 7E:
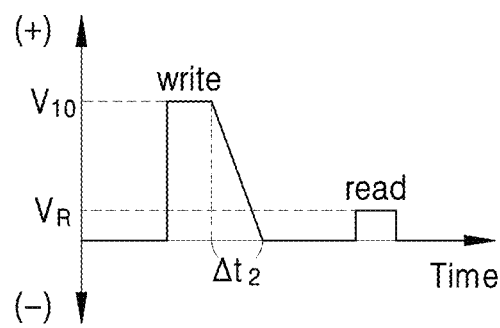

Referring to FIG. 7E, a fifth write pulse, which is a trapezoidal set pulse having a positive polarity, a second peak value less than the first peak value, and a second fall time length $\Delta t2$, may be applied to the memory cell. In this case, the memory cell may have a fifth logic state (state 5) in which both the switching material and the phase change material have a low resistance.

Figure 7F:
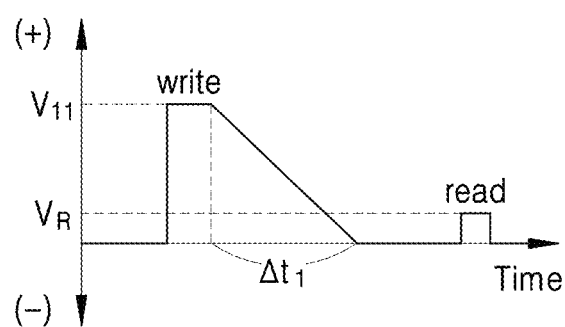

Referring to FIG. 7F, a sixth write pulse, which is a trapezoidal set pulse having a positive polarity, a second peak value less than the first peak value, and a first fall time length $\Delta t1$ greater than the second fall time length $\Delta t2$, may be applied to the memory cell. In this case, the memory cell may have a sixth logic state (state 6) in which the switching material has a low resistance and the phase change material has a lower or lowest resistance.

Figure 7G:
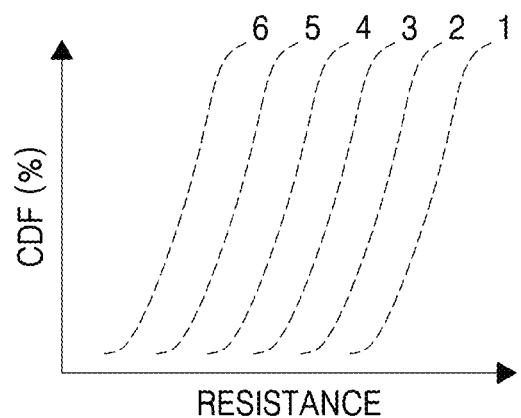
FIG. 7G is a graph illustrating states of a memory cell according to voltage pulses of FIGS. 7A to 7F.

FIG. 7G is a graph illustrating states of a memory cell according to voltage pulses of FIGS. 7A to 7F.

Referring to FIG. 7G, numbers 1 to 6 correspond to first to sixth logical states, respectively, and the first to sixth logical states correspond to FIGS. 7A to 7F, respectively. Each logic state is clearly distinguished in a cumulative distribution function (CDF) according to resistance. By adjusting the polarity, peak value, shape, and fall time length of a write pulse and applying the write pulse to a switching material of a selection layer and a phase change material of a phase change material layer, a plurality of logic states having different resistances may be represented. For example, the controller 130 may control the write/read portion 120 to apply one of the first to sixth write pulses shown in FIGS. 7A to 7F to the memory cell 110. Then, the memory cell 110 may have one of the first to sixth logic states. A multi-level cell may be implemented through the logic states having the different resistances.

Figure 8A:
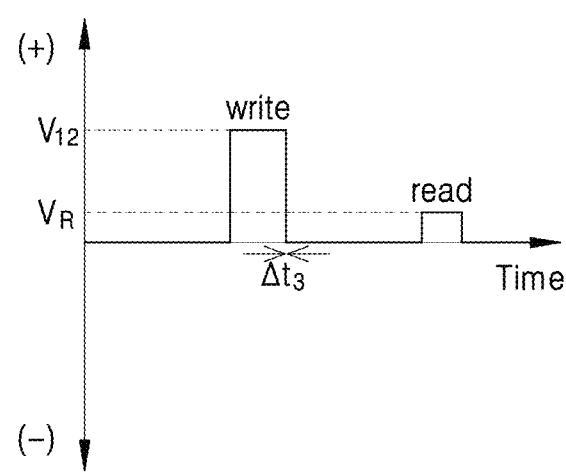
FIGS. 8A to 8C are graphs illustrating types of voltage pulses that may be applied to a memory cell according to another embodiment.
Figure 8B:
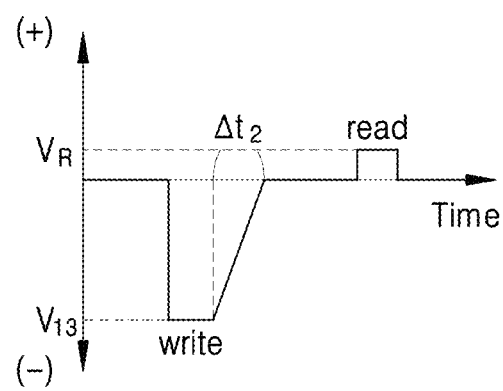
Figure 8C:
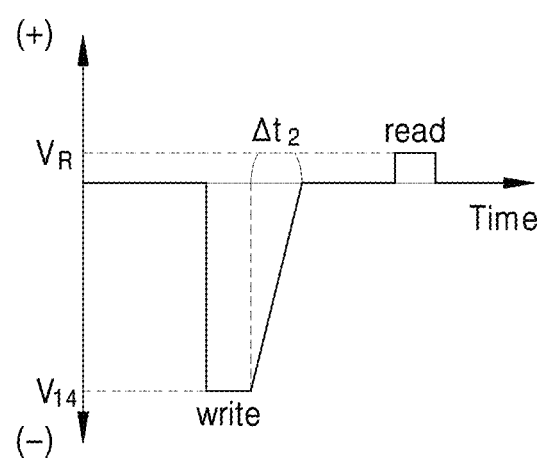

FIGS. 8A to 8C are graphs illustrating types of voltage pulses that may be applied to a memory cell according to at least one other embodiment.

A change in resistance when a write pulse is applied to a switching material and a phase change material is described with reference to FIGS. 8A to 8C.

Referring to FIG. 8A, a seventh write pulse having a first polarity and a third fall time length $\Delta t3$ may be applied to a selection layer and a phase change material layer by a controller. The third fall time length $\Delta t3$ may be 100 ns or less. The first polarity may be a positive polarity or a negative polarity. In this case, the memory cell may have a logic state A.

Referring to FIG. 8B, an eighth write pulse having a second polarity opposite to the first polarity, a second fall time length $\Delta t2$ different from the third fall time length $\Delta t3$, and a first peak value may be applied to the selection layer and the phase change material layer by the controller. When the first polarity is positive polarity, the second polarity may be negative polarity, and when the first polarity is negative polarity, the second polarity may be positive polarity. The second fall time length $\Delta t2$ may be greater than 100 ns and less than or equal to 1000 ns. In this case, the memory cell may have a logic state B.

Referring to FIG. 8C, the eighth write pulse may have a second peak value different from the first peak value. The absolute value of the second peak value may be greater than the absolute value of the first peak value. In this case, the memory cell may have a logic state C.

The controller 130 may control the write/read portion 120 to apply one of the seventh and eighth write pulses shown in FIGS. 8A to 8C to the memory cell 110. Then, the memory cell 110 may have one of the logic states A to C. A multi-level cell may be implemented through the logic states having the different resistances.

Figure 9:
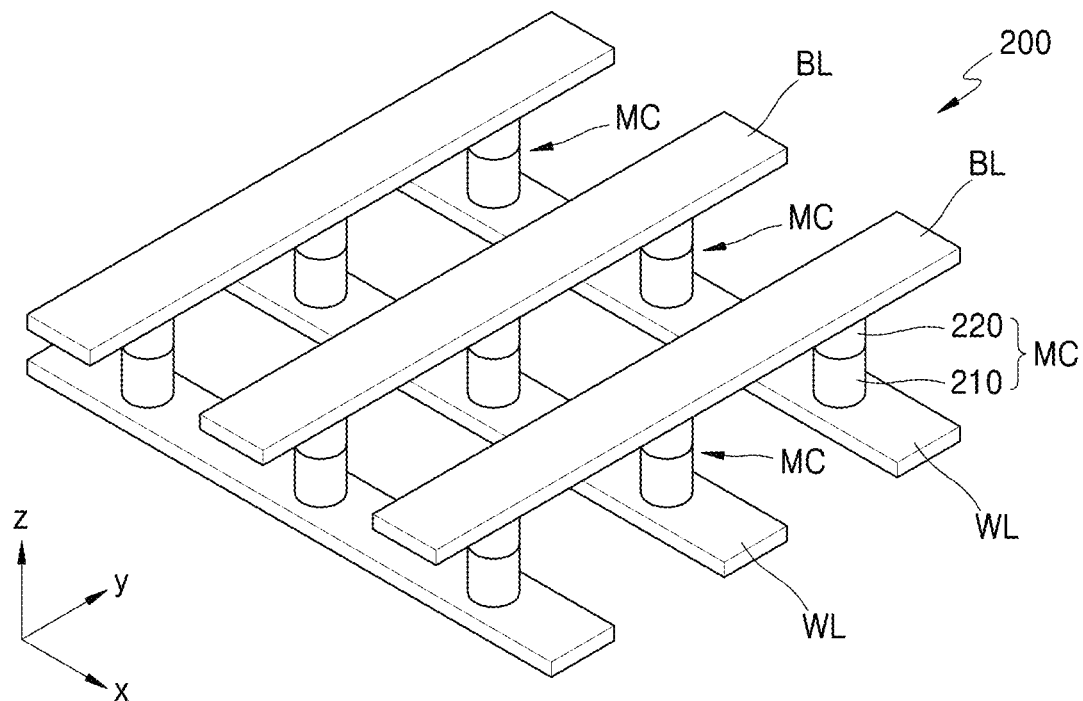
FIG. 9 is a perspective view of a memory cell according to at least one embodiment.

FIG. 9 is a perspective view of a memory cell 200 according to at least one embodiment.

Referring to FIG. 9, a memory device 200 may include a plurality of memory cells MC, and the memory cell MC may be the memory cell 110 of FIG. 3. The memory device 200 may have a three-dimensional (3D) cross-point array structure. The memory device 200 may include first electrode lines WL and second electrode lines BL, which are at different levels. For example, the memory device 200 may include the first electrode lines WL extending in the first direction (X direction) and spaced apart from each other in a second direction (Y direction) perpendicular to the first direction; and second electrode lines BL spaced apart from the first electrode lines WL in a third direction (Z direction), extending in parallel with each other in the second direction crossing the first direction; and spaced apart from each other in the first direction.

The memory cells MC may be arranged between the first electrode lines WL and the second electrode lines BL, respectively. The memory cells MC may be electrically connected to the first electrode lines WL and the second electrode lines BL and may be arranged at intersections thereof, respectively. The memory cells MC may be arranged in a matrix form. Each of the memory cells MC may include a selection layer 210 and a phase change material layer 220. For example, the selection layer 210 and the phase change material layer 220 may be connected in series in the third direction (Z direction), the selection layer 210 may be electrically connected to one of the first electrode line WL and the second electrode line BL, and the phase change material layer 220 may be electrically connected to the other of the first electrode line WL and the second electrode line BL. Various voltage signals or current signals may be provided through the first electrode lines WL and the second electrode lines BL, and thus, data may be written or read with respect to the selected memory cell MC, and data may be prevented from being written or read with respect to the remaining memory cells MC.

The array of memory cells MC may have a multi-deck structure. The memory cells MC may be stacked in the third direction (Z direction). For example, the array of memory cells MC may have a multi-deck structure in which the first electrode line WL and the second electrode line BL are alternately stacked in the third direction (Z direction). In this case, the memory cell MC may be positioned between the first electrode line WL and the second electrode line BL.

The memory cells MC may be arranged having the same structure in the third direction (Z direction). For example, in the memory cell MC arranged between the first electrode line WL and the second electrode line BL, the selection layer 210 may be electrically connected to the first electrode line WL, the phase change material layer 220 may be electrically connected to the second electrode line BL, and the selection layer 210 and the phase change material layer 220 may be connected in series, but the embodiments are not limited thereto. For example, unlike in FIG. 8, the positions of the selection layer 210 and the phase change material layer 220 may be switched or changed with each other in the memory cell MC. For example, in the memory cell MC, the phase change material layer 220 may be electrically connected to the first electrode layer WL, and the selection layer 210 may be electrically connected to the second electrode line BL.

The memory cell MC may have a pillar shape. For example, the memory cell MC may have a cylindrical shape and/or may have various column shapes, such as a square column, an elliptical column, a polygonal column, and/or the like.

The side of the memory cell MC may be perpendicular to a substrate such that, e.g., a cross-section of the memory cell MC perpendicular to a stacking direction (Z direction) as a constant area; however this is merely an example and the memory cell MC may have a structure in which an upper portion is wider than a lower portion or a lower portion is wider than an upper portion. In addition, the selection layer 210 and the phase change material layer 220 may each independently have a structure in which the width of an upper portion and the width of a lower portion are the same as or different from each other. The shape of the memory cell MC may vary depending on a method of forming each component.

The selection layer 210 may select the memory device 200 corresponding to the selection layer 210 and control a flow of current with respect to the corresponding memory device 200. For example, the selection layer 210 may include a material configured to change resistance according to the magnitude of a voltage applied across both ends thereof. For example, the selection layer 210 may have an OTS characteristic.

Because the selection layer 210 has excellent thermal stability, damage and/or degradation may be reduced in a process of manufacturing an electrical and/or semiconductor element, etc. For example, the selection layer 210 may have a crystallization temperature of 350° C. or more and 600° C. or less. For example, the crystallization temperature of the selection layer 210 may be 380° C. or more, 400° C. or more, 580° C. or less, and/or 550° C. or less. In addition, the selection layer 210 may have a glass transition temperature of 250° C. or more and 400° C. or less. For example, the glass transition temperature may be 280° C. or more, 300° C. or more, 380° C. or less, and/or 350° C. or less.

The selection layer 210 and the phase change material layer 220 may store information. Specifically, the selection layer 210 and the phase change material layer 220 may each have a resistance value that may vary depending on an applied voltage pulse. The memory device 200 may store and erase digital information, such as "0" or "1", and/or analog information, such as "0" to "1", according to a change in the resistance of the selection layer 210 and the phase change material layer 220. In at least one embodiment, the selection layer 210 may store and erase digital information (e.g., on/off) and the phase change material layer 220 may store and erase analog information.

A method of driving the memory device 200 is briefly described below. In the memory device 200, a voltage may be applied to the selection layer 210 and the phase change material layer 220 of the memory cell MC through the first electrode line WL and the second electrode line BL to allow a current to flow. The states of the selection layer 210 and the phase change material layer 220 may be changed to one of a plurality of resistance states by an applied pulse. The selection layer 210 may include a switching material, of which polarity changes according to an applied pulse. The switching material may be changed between a positive polarity and a negative polarity according to the polarity of the applied pulse, and data may be stored in the memory device 200 through the polarity change.

The phase change material layer 220 may include a phase change material, of which a crystal state changes according to an applied pulse. The phase of the phase change material may be reversibly changed by Joule's heat generated by a voltage applied across both ends of a memory element, and data may be stored in the memory device 200 through the phase change. The phase change material layer 220 may have a multi-layer structure in which two or more layers having different physical properties are stacked or may have a super-lattice structure in which a plurality of layers including different materials are alternately stacked. Each element constituting the phase change material may have various chemical composition ratios (stoichiometry), and the crystallization temperature and melting point of the phase change material, phase change speed according to crystallization energy, and information retention may be controlled according to the chemical composition ratio of each element. For example, the chemical composition ratio (stoichiometry) may be adjusted so that the crystal phase transition point of the phase change material may be about 500° C. to about 800° C.

In addition, any memory cell MC may be addressed by selecting the first electrode line WL and the second electrode line BL, and a certain pulse may be applied between the selected first electrode line WL and the selected second electrode line BL to program the memory cell MC. In addition, by measuring a current value through the second electrode line BL, information according to the resistance value of the memory cell MC, that is, programmed information, may be read.

When a material of the memory element included in the memory device 200 includes a phase change material that reversibly changes between an amorphous state and a crystalline state, the memory device 200 may be referred to as a phase-change random access memory (PRAM). The phase of the PRAM may be reversibly changed by Joule's heat generated by a voltage applied across both ends of the memory element, and data may be stored in the memory element through the phase change. For example, the phase change material may be in a high resistance state in an amorphous phase and be in a low resistance state in a crystalline phase. By defining the high resistance state as '0' and the low resistance state as '1', data may be stored in the memory element.

In addition to PRAM, the memory device 200 may be resistive random access memory (RRAM), magnetic random access memory (MRAM), a memristor, and/or the like.

From this, according to implementations according to the technical idea of the disclosure, a memory device having a high read window margin and enabling subdivision of a state to implement multi-level may be provided.

Figure 10:
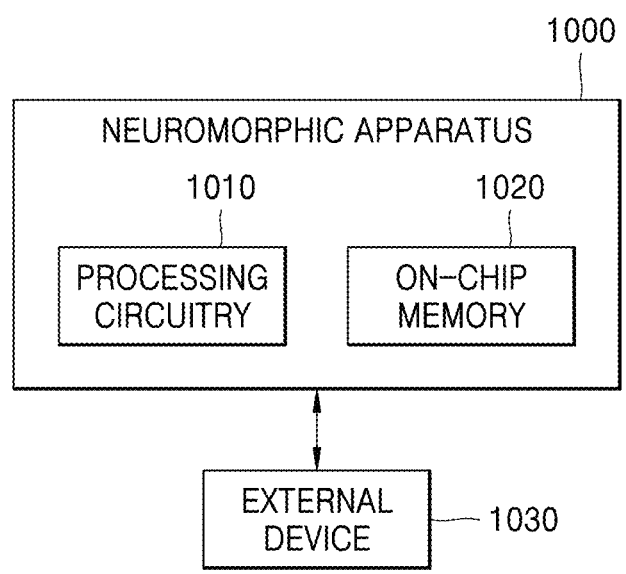
FIG. 10 is a schematic block diagram of a neuromorphic apparatus including a memory device.

The memory device described so far may be implemented in the form of a chip and used as a neuromorphic computing platform. For example, FIG. 10 is a schematic block diagram of a neuromorphic apparatus 1000 including a memory device. Referring to FIG. 10, the neuromorphic apparatus 1000 may include a processing circuitry 1010 and/or a memory 1020. The memory 1020 of the neuromorphic apparatus 1000 may include the memory device 100 according to at least one embodiment.

The processing circuitry 1010 may be configured to control functions for driving the neuromorphic apparatus 1000. For example, the processing circuitry 1010 may control the neuromorphic apparatus 1000 by executing a program, e.g., stored in the memory 1020 of the neuromorphic apparatus 1000 and/or memory attached to the neuromorphic apparatus 1000. The processing circuitry 1010 may include hardware, such as logic circuitry, a combination of software and hardware, such as a processor that executes the software, or a combination thereof. For example, the processor may include at least one of a central processing unit (CPU), a graphics processing unit (GPU), an application processor (AP) in the neuromorphic apparatus 1000, an arithmetic logic unit (ALU), a digital processor, a microcomputer, a field programmable gate array (FPGA), a system-on-chip (SoC), a programmable logic unit, a microprocessor, an application-specific integrated circuit (ASIC), and/or the like. Also, the processing circuitry 1010 may read and write various pieces of data from and to an external device 1030 and operate the neuromorphic apparatus 1000 by using the data. The external device 1030 may include an external memory and/or a sensor array including an image sensor (e.g., a CMOS image sensor circuit).

The neuromorphic apparatus 1000 shown in FIG. 10 may be applied to a machine learning (ML) system. For example, the neuromorphic apparatus 1000 may be configured to apply, as an input for the ML system, a read voltage to a memory cell in the memory 1020. In at least one embodiment, the read voltage may be adjusted to represent different values, so long as the read voltage remains less than the write or reset voltages. In these cases, the resistance of the memory cell may represent a weight stored in the memory cell, and a change in the voltage output from the memory cell may represent a multiplication operation between the input and the weight. In at least one embodiment, the magnitude of the output voltage may represent an analog value, which may be converted to a digital signal by comparing the output voltage to at least one threshold voltage or which may be applied as an input to, e.g., another memory cell. The machine learning system may use various artificial neural network organizations and processing models, the artificial neural network organizations including, for example, a convolutional neural network (CNN), a deconvolutional neural network, a recurrent neural network optionally including a long short-term memory (LSTM) and/or a gated recurrent unit (GRU), a stacked neural network (SNN), a state-space dynamic neural network (SSDNN), a deep belief network (DBN), a generative adversarial network (GAN), and/or a restricted Boltzmann machine (RBM).

Alternatively or additionally, such machine learning systems may include other forms of machine learning models, such as, for example, linear and/or logistic regression, statistical clustering, Bayesian classification, decision trees, dimensionality reduction such as principal component analysis, and/or expert systems; and/or combinations thereof, including ensembles such as random forests. Such machine learning models may be used to provide various services, such as an image classification service, a user authentication service based on biometric information or biometric data, an advanced driver assistance system (ADAS), a voice assistant service, and an automatic speech recognition (ASR) service, and may be installed and executed in other electronic devices.

According to the disclosed embodiments, a memory device may control the polarity, peak value, shape, and fall time length of a write pulse to have a high read window margin and to enable subdivision of a state to implement multi-level.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A memory device comprising:
   a memory cell including a selection layer and a phase change material layer connected in series, the selection layer comprising a switching material and the phase change material layer comprising a phase change material; and
   a controller configured to control a polarity, a peak value, and a shape of write pulses applied to the memory cell to change a resistance of the selection layer, to change a resistance of the phase change material, and to change the resistances of both the selection layer and the phase change material,
   wherein the switching material is configured such that the resistance of the switching material is changed according to at least one of the polarity or peak value of the applied write pulse, and
   wherein the phase change material is configured such that the resistance of the phase change material is changed according to the shape of the applied write pulse.

2. The memory device of claim 1, wherein the controller is further configured to adjust a resistance of the phase change material by controlling a fall time length of the write pulses.

3. The memory device of claim 1, wherein the controller is configured to control an application of a first write pulse to the memory cell,
   wherein the first write pulse includes a negative polarity, a first peak value, and a rectangular shape.

4. The memory device of claim 3, wherein, after the first write pulse, the memory cell has a first logic state in which both the switching material and the phase change material have a first high resistance when the first write pulse is applied to the memory cell.

5. The memory device of claim 4, wherein the controller is configured to control an application of a second write pulse to the memory cell,
   wherein the second write pulse includes the negative polarity, a second peak value less than the first peak value, and a rectangular shape.

6. The memory device of claim 5, wherein, after the second write pulse, the memory cell has a second logic state in which both the switching material and the phase change write pulse is applied to the memory cell and the second high resistance is less than the first high resistance.

7. The memory device of claim 5, wherein the controller is configured to control an application of a third write pulse to the memory cell,
wherein the third write pulse includes a positive polarity, a second peak value less than the first peak value, and a rectangular shape.

8. The memory device of claim 7, wherein, after the third write pulse, the memory cell has a third logic state in which the switching material has a low resistance and the phase change material has a first high resistance when the third write pulse is applied to the memory cell.

9. The memory device of claim 7, wherein the controller is configured to control an application of a fourth write pulse to the memory cell,
wherein the fourth write pulse includes the negative polarity, a second peak value less than the first peak value, and a trapezoidal shape.

10. The memory device of claim 9, wherein, after the fourth write pulse, the memory cell has a fourth logic state in which the switching material has a second high resistance and the phase change material has a low resistance when the fourth write pulse is applied to the memory cell, and the second high resistance is less than the first high resistance.

11. The memory device of claim 9, wherein the controller is configured to control an application of a fifth write pulse to the memory cell,
wherein the fifth write pulse includes a positive polarity, a second peak value less than the first peak value, a first fall time length, and a trapezoidal shape.

12. The memory device of claim 11, wherein, after the fifth write pulse, the memory cell has a fifth logic state in which both the switching material and the phase change material have a low resistance when the fifth write pulse is applied to the memory cell.

13. The memory device of claim 12, wherein the controller is configured to control an application of a sixth write pulse to the memory cell,
wherein the sixth write pulse includes the positive polarity, a third peak value less than the first peak value, a second fall time length greater than the first fall time length, and a trapezoidal shape.

14. The memory device of claim 13, wherein, after the sixth write pulse, the memory cell has a sixth logic state in which the switching material has a low resistance and the phase change material has a lower resistance compared to the fifth logic state.

15. The memory device of claim 1, wherein the switching material includes a chalcogenide material,
wherein the chalcogenide material includes
a first element including germanium (Ge),
a second element including at least one of arsenic (As) or antimony (Sb),
a third element including at least one of tellurium (Te), selenium (Se), or sulfur(S), and
a fourth element including at least one of indium (In), aluminum (Al), carbon (C), boron (B), strontium (Sr), gallium (Ga), oxygen (O), nitrogen (N), silicon (Si), calcium (Ca), or phosphorus (P).

16. The memory device of claim 1, wherein the phase change material includes a chalcogenide material,
wherein the chalcogenide material includes
a first element including germanium (Ge),
a second element including at least one of arsenic (As) or antimony (Sb),
a third element including at least one of tellurium (Te), selenium (Se), or sulfur(S), and
a fourth element including at least one of indium (In), aluminum (Al), carbon (C), boron (B), strontium (Sr), gallium (Ga), oxygen (O), nitrogen (N), silicon (Si), calcium (Ca), or phosphorus (P).

17. A memory device comprising:
a selection layer including a switching material;
a phase change material layer connected in series with the selection layer; and
a controller configured to control an application, to the selection layer and the phase change material layer, of a first write pulse having a first polarity and a first fall time length and of a second write pulse having a second polarity opposite to the first polarity and a second fall time length different from the first fall time length,
wherein the switching material is configured such that a resistance of the switching material is changed according to at least one of a polarity or peak value of an applied write pulse, and
wherein the phase change material is configured such that a resistance of the phase change material is changed according to a shape of the applied write pulse.

18. The memory device of claim 17, wherein the first write pulse has a first peak value, and the second write pulse has a second peak value different from the first peak value.

* * * * *